United States Patent
Leirens (10) Patent No.: US 10,838,034 B2
(45) Date of Patent: Nov. 17, 2020

(54) CALIBRATION METHOD FOR A TRIAXIAL SENSOR WITH SELECTION OF A CALIBRATION METHOD AS A FUNCTION OF THE SPATIAL DISTRIBUTION OF MEASUREMENTS

(71) Applicant: COMMISSARIAT À L'ÉNERGIE ATOMIQUE ET AUX ÉNERGIES ALTERNATIVES, Paris (FR)

(72) Inventor: Sylvain Leirens, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 103 days.

(21) Appl. No.: 16/272,322

(22) Filed: Feb. 11, 2019

(65) Prior Publication Data

US 2019/0250238 A1    Aug. 15, 2019

(30) Foreign Application Priority Data

Feb. 14, 2018   (FR) ..................................... 18 51250

(51) Int. Cl.
| | |
|---|---|
| G01R 35/00 | (2006.01) |
| G01R 33/10 | (2006.01) |
| G01C 17/38 | (2006.01) |
| G01R 33/02 | (2006.01) |
| G01P 21/00 | (2006.01) |

(Continued)

(52) U.S. Cl.
CPC .......... G01R 35/005 (2013.01); G01C 17/38 (2013.01); G01C 25/00 (2013.01); G01P 21/00 (2013.01); G01R 33/0005 (2013.01); G01R 33/0206 (2013.01); G01R 33/10 (2013.01)

(58) Field of Classification Search
None
See application file for complete search history.

(56) References Cited

U.S. PATENT DOCUMENTS 5,701,259 A * 12/1997 Dittrich .................. G01C 17/38
                                                                702/92
6,356,376 B1 * 3/2002 Tonar .................... B60Q 1/2665
                                                               359/267

FOREIGN PATENT DOCUMENTS

| WO | 03/074969 A2 | 9/2003 |
|---|---|---|
| WO | 2007026238 A1 | 3/2007 |

OTHER PUBLICATIONS

Search Report for French Application No. 1851250 dated Nov. 20, 2018.

(Continued)

*Primary Examiner* — Paresh Patel
(74) *Attorney, Agent, or Firm* — Pearne & Gordon LLP (57) ABSTRACT

A method of calibrating a triaxial sensor such as a magnetometer. The method includes steps (DIS) to calculate a spatial distribution indicator of a set of measurements output by the sensor, and to determine (AJS), using a fitting method, parameters of a parametric surface that can be used to fit said surface to the set of measurements. The fitting method is selected from among several predetermined fitting methods as a function of the spatial distribution indicator. The predetermined fitting methods may include an ellipsoid fitting method, a sphere fitting method, a sphere fitting method and a two-step fitting method consisting of a first fitting to a sphere followed by a second fitting to an ellipsoid, the centre of which is coincident with the centre of the sphere of the first fitting.

11 Claims, 4 Drawing Sheets

(51) Int. Cl.
    *G01R 33/00* (2006.01)
    *G01C 25/00* (2006.01)

(56) References Cited

OTHER PUBLICATIONS

Olivares, A. et al. "Automatic Determination of Validity of Input Data Used in Ellipsoid MARG Calibration Algorithms" In: Sensors, Sep. 5, 2013, vol. 13. No. 9, pp. 11797-11817.
Gietzelt, M. et al. "Performance comparison of accelerometer calibration algorithms based on 3D-ellipsoid fitting methods" In: Computer Methods and Programs in Biomedicine, Jul. 2013, vol. 111, No. 1, pp. 62-71.
U.S. Appl. No. 16/150,555 titled Method for Locating Mobile Devices in a Common Frame of Reference, filed Oct. 3, 2018.
U.S. Appl. No. 16/150,859 titled "Method of Locating an Access Point to a Communication Network", filed Oct. 3, 2018.

\* cited by examiner

CALIBRATION METHOD FOR A TRIAXIAL SENSOR WITH SELECTION OF A CALIBRATION METHOD AS A FUNCTION OF THE SPATIAL DISTRIBUTION OF MEASUREMENTS

TECHNICAL DOMAIN

The domain of the invention is calibration of a triaxial sensor. The invention relates most particularly to an automatic calibration made continuously while the sensor is in use.

STATE OF PRIOR ART

A magnetometer can be integrated into an inertial navigation unit to make a measurement of the earth's magnetic field, so that the heading of a device on which said unit is mounted can be determined.

In the absence of any errors and local disturbances, the magnetometer measures only the earth's magnetic field vector. However, when the inertial unit is contaminated by some errors, the measurement of the earth's magnetic field vector is different from the real value of the earth's magnetic field vector, called the reference value. Errors present on magnetometer measurements are not limited to errors intrinsic to the sensor such as the scale factor, misalignment and bias, but can also be caused by the external environment, particularly hard iron errors that originate from the presence of magnetised materials, such as those present in electronic components, the power supply circuit, etc. and soft iron errors that are generated by the deformation of magnetic field lines in the external environment of the sensor, for example due to the presence of cables, screws and metallic nuts, etc.

Therefore the magnetometer must be calibrated to correct the raw measurements from the errors mentioned above. This problem also arises for other sensors of the inertial unit, namely for the accelerometer and the gyrometer.

Most calibration algorithms are based on a method of fitting raw measurements on a parametric surface, typically an ellipsoid, the difference between this ellipsoid and a sphere with radius equal to the norm of the earth's magnetic field being representative of errors affecting the magnetometer. The transformation to change from the ellipsoid to the sphere is then applied to the raw measurements to correct them for the above-mentioned errors.

If these calibration algorithms are to be efficient and even to supply sufficiently precise calibration parameters, it is necessary to be able to acquire well distributed measurements, namely points covering the entire ellipsoid. However in practice, when the magnetometer is in use, measurements that can be collected are generally badly distributed and do not cover some parts of the ellipsoid.

This observation is reported particularly in the paper by A. Olivares et al. "Automatic Determination of Validity of Input Data Used in Ellipsoid Fitting MARG Calibration Algorithms," Sensors, vol. 13, No. 9, pp. 11797-11817, September 2013. The authors of this article thus demonstrate that an error in ellipsoid fitting algorithms can be determined by analysing the spatial distribution of the raw measurements of the magnetometer. These authors then propose to use these calibration algorithms only when the expected error is less than a threshold. This article indicates that the best indicator for validity of the distribution of the raw measurements is that of the convex envelope. However this indicator has the disadvantage that it requires consequent calculation resources.

PRESENTATION OF THE INVENTION

The purpose of this invention is to improve known calibration techniques, and to achieve this it discloses a method implemented by a computer to calibrate a triaxial sensor comprising steps to calculate a spatial distribution indicator of a set of measurements output by the triaxial sensor and to determine, according to a fitting method, parameters of a parametric surface that can be used to fit said surface to said set of measurements. The fitting method is selected particularly from among several predetermined fitting methods as a function of said spatial distribution indicator.

Some preferred but non-limitative aspects of this method are as follows:

- the predetermined fitting methods comprise or consist in an ellipsoid fitting method, a sphere fitting method and a two-step fitting method consisting of a first fitting to a sphere followed by a second fitting to an ellipsoid, the centre of which is coincident with the centre of the sphere of the first fitting;
- When the spatial distribution indicator is less than a first threshold, the selected fitting method is the ellipsoid fitting method, when the spatial ellipsoid distribution indicator is more than the first threshold and less than a second threshold, the selected fitting method is the two-step fitting method, and when the spatial distribution indicator is more than the second threshold, the selected fitting method is the sphere fitting method;
- the spatial distribution indicator calculation step comprises sub-steps to determine a correlation matrix of the measurements of said set and to determine the condition number of the correlation matrix, said condition number forming the spatial distribution indicator;
- it includes a preliminary step to select measurements of said set among the measurements output by the triaxial sensor, said preliminary step including an estimate of a change in the orientation of the triaxial sensor between the output measurements and the selection of measurements associated with sensor orientations deemed to be sufficiently different by comparison with a threshold;
- the triaxial sensor is a magnetometer and the estimate of a change in the sensor orientation between the measurements includes determination of the difference between the amplitude of a measurement component and amplitudes of previously selected measurement components;
- the triaxial sensor is a magnetometer and the estimate of a change in the orientation of the magnetometer between the measurements makes use of measurements output by a gyrometer, or measurements output by the magnetometer and measurements output by an accelerometer;
- It includes determination of a test transformation to transform the parametric surface fitted to said set of measurements into a unit sphere, application of the test transformation to the measurements of said set to supply transformed measurements and determination of a degree of fit of the transformed measurements to the unit sphere;
- It also comprises application of a current calibration transformation to the measurements of said set to supply calibrated measurements, determination of a degree of fit of the calibrated measurements to the unit sphere and selection of the test transformation as a new current calibration transformation if the degree of fit of the transformed measurements to the unit sphere is more than the degree of fit of the calibrated measurements to the unit sphere.

BRIEF DESCRIPTION OF THE DRAWINGS

Other aspects, purposes, advantages and characteristics of the invention will be better understood after reading the detailed description given below of preferred embodiments of the invention, given as non-limitative examples, with reference to the appended drawings on which.

DETAILED PRESENTATION OF PARTICULAR EMBODIMENTS

The invention applies to a computer-implemented for calibrating a triaxial sensor and more particularly an automatic calibration done when the triaxial sensor is in use. The sensor is typically integrated into an inertial navigation unit. The following description relates to the non-limitative example of a magnetometer, but the invention includes other types of sensor, particularly an accelerometer and/or a gyrometer.

The measurement X of the three components of the earth's magnetic field $B_r$ made by a magnetometer is affected by errors that can be modelled in the following matrix form: $X=W.B_r+b$, wherein b represents a bias introduced principally by interference of hard iron and W is a 3*3 matrix that can be broken down as $W=W_{gain} \cdot W_{mis} \cdot W_{soft}$ wherein $W_{gain}$ is a diagonal matrix modelling scale factor errors, $W_{mis}$ is a matrix modelling alignment defect (non-orthogonality) errors of the measurement axes and $W_{soft}$ is a matrix modelling errors introduced by soft iron interference. We thus have $$W_{gain} = \begin{pmatrix} g_x & 0 & 0 \\ 0 & g_y & 0 \\ 0 & 0 & g_z \end{pmatrix} \text{ and } W_{mis} = \begin{pmatrix} 1 & -\epsilon_z & \epsilon_y \\ \epsilon_z & 1 & -\epsilon_x \\ -\epsilon_z & \epsilon_x & 1 \end{pmatrix}.$$

Calibration of the magnetometer is aimed at identifying W and b to subsequently calculate calibrated measurements from which errors have been removed: $X_c=W^{-1}(X-b)$.

The magnetometer measures a constant 3D field in the absence of disturbances. If the orientation of the magnetometer in this constant field is modified, the measurements should be supported by a sphere. But biases, scale factors and alignment defects transform this sphere into a quadratic surface, typically an ellipsoid. A calibration technique then consists of determining the parameters of a parametric surface that can be used to fit said surface to the measurements, and then to determine the inverse transformation that will change this surface into the unit sphere. This inverse transformation is then applied to the measurements so as to supply calibrated measurements from which the errors mentioned above have been removed.

As mentioned above, in order for this calibration technique to provide sufficiently precise calibration parameters ($D=W^{-1}$ and b), the measurements must be spatially well distributed in the sense that they cover the entire ellipsoid. The invention proposes to calculate an indicator of a good or bad spatial distribution of the measurements, and to use this indicator as a criterion to select one among several predetermined methods of fitting a parametric surface to the measurements.

As mentioned in the above-mentioned paper by A. Olivares et al., an equation of the form $X=W.B_r+b$ is also applicable to other sensors of the inertial unit, replacing Br by the earth's gravitational field in the case of the accelerometer (its norm is generally 1 if the acceleration measurement unit is g) and replacing Br by a constant angular velocity in the case of a gyrometer.

Figure 1A:
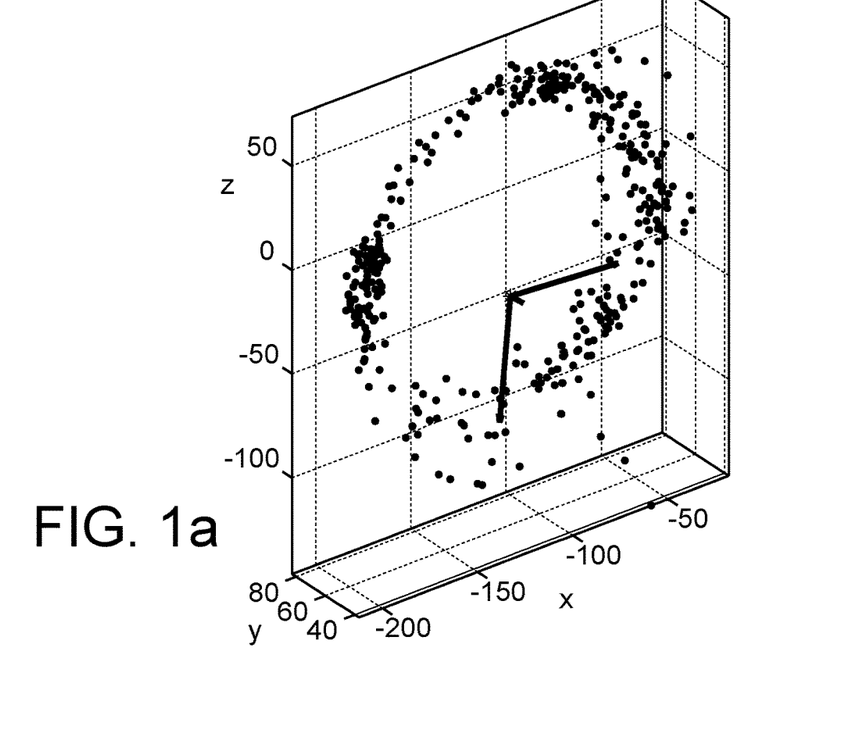
FIGS. 1a and 1b represent examples of spatial distribution of measurements output by a magnetometer.
Figure 1B:
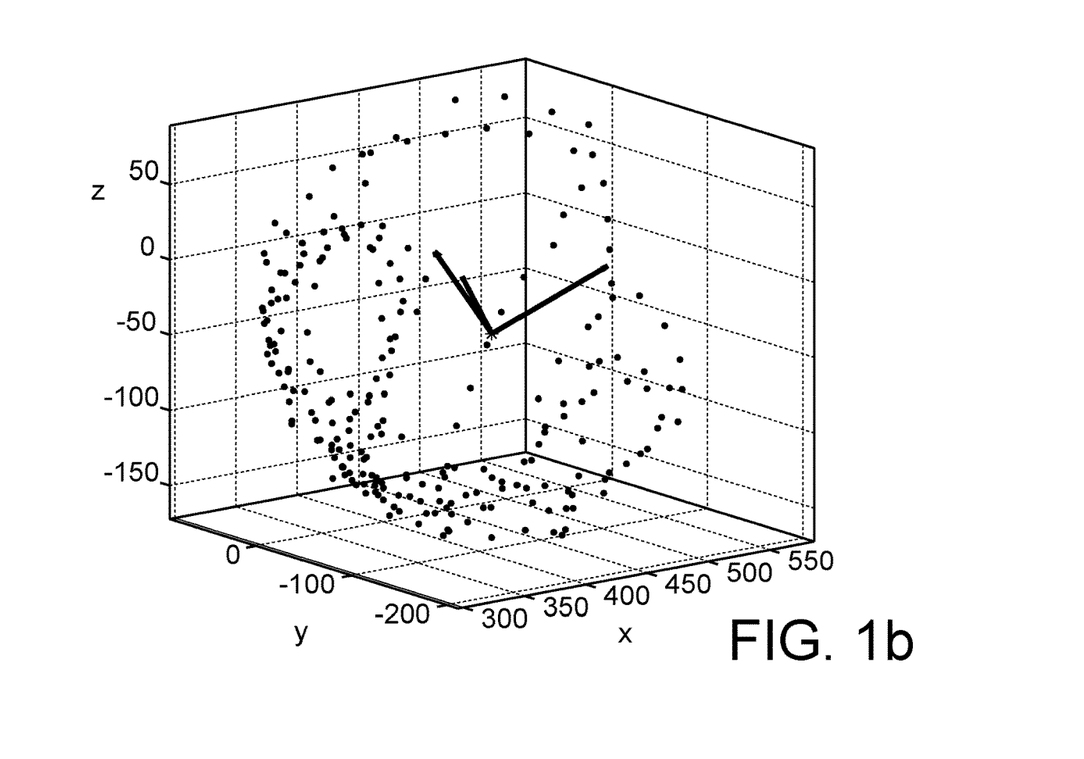

Examples of spatial distribution of measurements output by the magnetometer are shown in FIGS. 1a and 1b. Measurements on FIG. 1a are practically coplanar and therefore are particularly badly distributed. On the contrary, on FIG. 1b, the measurements satisfactorily cover the surface of an ellipsoid and therefore appear well distributed. According to the invention, the fitting method used to determine the parameters of the parametric surface to be fitted to the measurements will be different for the measurements in FIGS. 1a and 1b.

Figure 2:
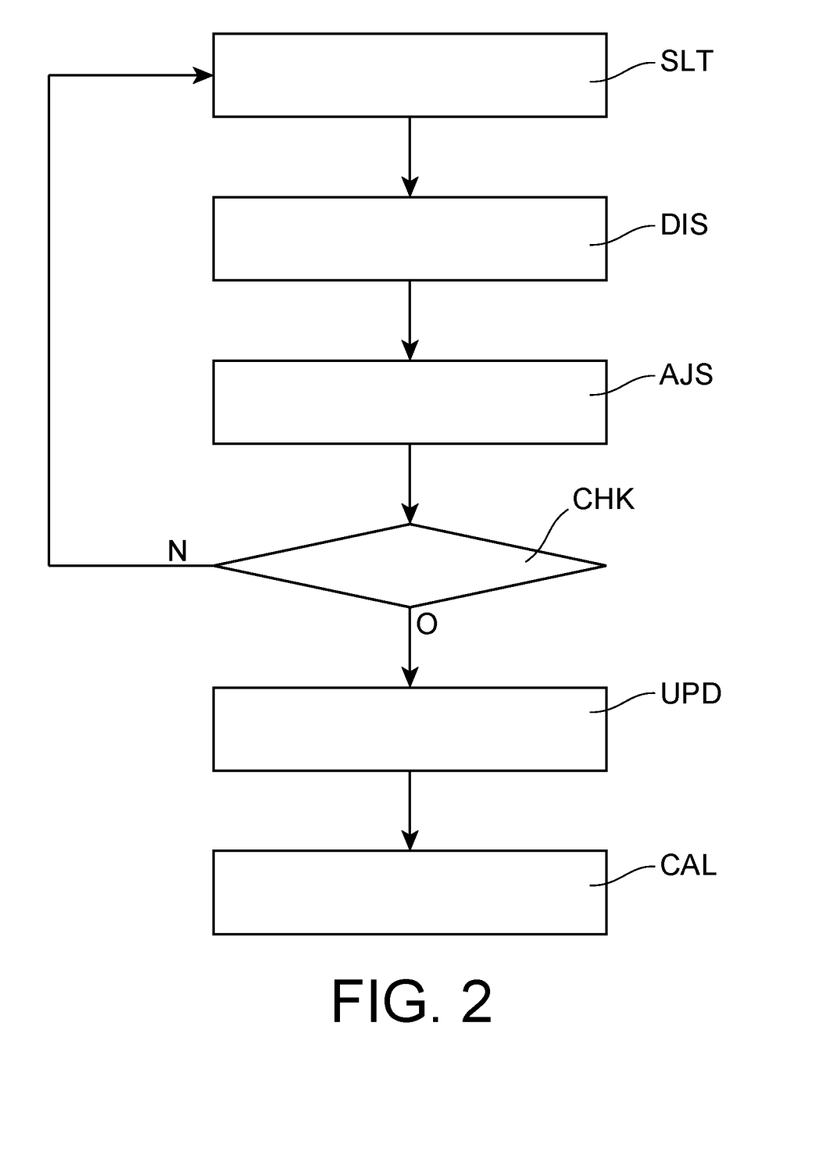
FIG. 2 is a flow chart showing the different steps in the method according to the invention.

With reference to FIG. 2, the method according to the invention more particularly comprises a step DIS to calculate a spatial distribution indicator of a set of measurements output by the magnetometer. The method also comprises a step AJS to determine according to a fitting method, parameters of a parametric surface that can be used to fit the parametric surface to the set of measurements output by the magnetometer. The fitting method is selected from among several predetermined fitting methods as a function of the spatial distribution indicator calculated during the calculation step DIS.

The predetermined fitting methods can include an ellipsoid fitting method, a sphere fitting method and a two-step fitting method consisting of a first fitting to a sphere followed by a second fitting to an ellipsoid, the centre of which is coincident with the centre of the sphere of the first fitting. In one variant embodiment, the predetermined fitting methods may consist of these three above-mentioned methods. Ellipsoid fitting methods and sphere fitting methods are said to be one-step methods in that they aim at directly fitting to the parametric surface concerned, as opposed to a two-step fitting method that consists of a first fit followed by a second fit that uses the results of the first fit.

The ellipsoid fit method can include a rotated ellipsoid fit requiring the determination of 9 parameters or a non-rotated ellipsoid fit requiring the determination of 6 parameters.

An example of a two-step fitting method is described particularly in the paper by M. Gietzelt et al., "Performance comparison of accelerometer calibration algorithms based on 3D-ellipsoid fitting methods" Comput. Methods Programs Biomed., vol. 111, No. 1, pp. 62-71, July 2013.

The sphere fitting method requires the determination of 4 parameters. It is used to calculate biases related to hard iron interference and to approximate scale factors. It provides a calibration considered to be a degraded mode.

For example, the spatial distribution indicator is lower when the measurements are well distributed. Then in one possible embodiment, when the spatial distribution indicator is less than a first threshold, the selected fitting method is the ellipsoid fitting method (in one step), when the spatial ellipsoid distribution indicator is more than the first threshold and less than a second threshold, the selected fitting method is the two-step fitting method, and when the spatial distribution indicator is more than the second threshold, the selected fitting method is the sphere fitting method (in one step). Obviously, other thresholds can be used, for example such as a threshold to determine whether to use a rotated ellipsoid fit or a non-rotated ellipsoid fit.

In one embodiment of the invention, the invention adopts a principal components analysis type approach to evaluate the dispersion of measurements. More precisely, the spatial distribution indicator calculation DIS comprises the determination of the measurement correlation matrix for the set of measurements and the determination of the condition number of the correlation matrix.

We consider a set of N measurements of the three components of the magnetic field and Xm the 3*N matrix of the centred measurements. The centre c of the measurements is calculated using the "min-max-average" method. For example for the x axis, $c_x=(m_{x,min}+m_{x,max})/2$, wherein $m_{x,min}$ and $m_{x,max}$ represent the minimum and maximum respectively of all measurements on the x axis. Alternatively, the centre of the measurements can be calculated using the average or the median of the measurements, but in practice the set of measurements is often badly distributed and the centre can be too far from the average (or the median).

The correlation S is expressed as $$S = \frac{1}{N-1}(X_m X_m^T).$$

The eigenvalues $\lambda_i$ ($i \in \{1,2,3\}$) of the matrix S are representative of variances of measurements along each eigenvector. Therefore the eigenvalues $\lambda_i$ contain useful information about the dispersion of measurements. More particularly, the condition number of the matrix S, namely the ratio of the largest eigenvalue to the smallest eigenvalue is close to 1 when the measurements are well distributed and increases as the measurements become more badly distributed. This condition number is written as $$r = \frac{\max_i \lambda_i}{\min_i \lambda_i}$$

and is used to select the fitting method to be used. For example, when r is less than a first threshold $r_1$, the selected fitting method is the ellipsoid fitting method (in one step), when r is more than the first threshold $r_1$ and less than a second threshold $r_2$, the selected fitting method is the two-step fitting method, and when r is more than the second threshold $r_2$, the selected fitting method is the sphere fitting method (in one step).

The method according to the invention can include a preliminary step SLT to select the measurements of said set among the measurements output by the magnetometer. This preliminary step includes an estimate of a change to the orientation of the magnetometer between the measurements and the selection of measurements associated with orientations of the magnetometer considered to be sufficiently different, for example by comparison with a threshold. In assuring that the selected measurements are made for different orientations of the magnetometer, preference is given to assuring that these measurements can cover an ellipsoid.

The estimate of a change in the orientation of the magnetometer can make use of measurements output by the magnetometer. This estimate can include the evaluation of a measurement by determining the difference $|\xi-\xi_n|$ between the amplitude $\xi$ of the component of the evaluated measurement and the amplitude $\xi_n$ of a component of a previously selected measurement in said set, for each component of the evaluated measurement. If this difference is larger than a predetermined threshold $\tau_{mag}$, for example equal to 10 µT, for all previously selected measurements in said set, the evaluated measurement is selected. In practice, it is sufficient to compare $\xi$ with the amplitude of the component of the last selected measurement (in this case designated by the index n).

The estimate of a change to the orientation of the magnetometer can make use of measurements output by a gyrometer, for example when the magnetometer is integrated into an inertial unit. A magnetometric measurement associated with a measurement of the angular velocity vector output by the gyrometer, one component $\omega \in \{\omega_x, \omega_y, \omega_z\}$ of which is more than a threshold $\tau_{gyr}$, for example 30°/s, is then selected.

As a variant, measurements output by the gyrometer are used to estimate a difference in orientation of the gyrometer at a current instant and at a previous instant corresponding to the last selection of a measurement. With this variant, the relative attitude of the gyrometer is estimated using a temporal integration of measurements output by the gyrometer, assuming that biases of the gyrometer are compensated, or simply neglecting it. The quaternion differentiation formula, $\dot{q}(t)=\frac{1}{2}q(t)\otimes\overline{\omega}(t)$, can be discretised using Euler's method to calculate the current orientation q(t) from $\omega(\eta)$ for $\eta \in [t_n, t]$, wherein $t_n$ is the time corresponding to the last selection of a measurement. An error $q_e$ is calculated, representative of a difference in orientation between the current quaternion q(t) and the quaternion associated with the last selected method $q(t_n)$, according to $q_e = q(t) \otimes q^*_0$. The angle of $q_e$ in the axis-angle representation of the quaternion $q_e$ is given by $\alpha = \cos^{-1} q_{e,0}$, wherein $q_{e,0}$ is the real part of the error $q_e$. The current magnetometric measurement is selected if $\alpha > \tau_{gyrint}$, where $\tau_{gyrint}$ is a threshold equal for example to 30°.

The estimate of a change to the orientation of the magnetometer can also make use of measurements output by the magnetometer and by an accelerometer, for example when the magnetometer is integrated into an inertial unit. The TRIAD method can be used in this respect to search for magnetometric measurements made at sufficiently different angles. As for the previous approach, an angle $\alpha$ is calculated as a difference between the current orientation q(t) and the corresponding orientation associated with the last selected measurement, $\alpha = \cos^{-1} q_{e,0}$, and the current magnetometric measurement is selected if $\alpha > \tau_{acc}$, wherein $\tau_{acc}$ is a threshold, for example equal to 30°. This approach does not require that gyrometric measurements are stored to make the temporal integration since absolute orientations are calculated starting from measurements output by the magnetometer and by the accelerometer. However, this approach is based on the assumption that there is no linear acceleration.

One or several other constraints can be used during this preliminary magnetometric measurements selection step to form said set acting as a reference for fitting a parametric surface. A first constraint may for example consist of a minimum time between two successively selected measurements, for example 0.1 s. Another constraint may for example consist of a maximum time between two successively selected measurements, for example 1 s. If this time is exceeded, the previous step is reinitialised. Yet another constraint relates to the number of measurements to be selected, for example with a minimum number and a maximum number of measurements, for example between 100 and 200 measurements to be selected during the preliminary step.

Following the determination step AJS, depending on the selected fitting method, parameters of the parametric surface, the method according to the invention may include a step CHK to check the quality of the fit.

This check step CHK may include the study of analytic properties of matrices involved in fitting. This study can thus check whether or not the matrix representing the measurements is a full rank matrix in the least squares sense. Indeed strictly coplanar measurements do not form a full rank matrix. This study can also include the matrix representing the surface determined by parameters determined in the AJS step. The objective of ellipsoid fitting methods is specifically to identify a positive definite symmetric matrix A appearing in the equation $(X-b)^T A(X-b)=c$. If the identified matrix is not positive definite, the fitting quality is deemed to be insufficient.

The check step CHK to check the fit quality may also include determination of a test transformation to transform the parametric surface fitted to said set of measurements (i.e. the surface defined by parameters determined in step AJS), into a sphere, application of the test transformation to measurements of said set to supply transformed measurements and determination of a degree of fit of the transformed measurements to the sphere.

The test transformation may for example aim to transform the configured surface into a unit sphere and determination of a degree of fit of transformed data to the sphere includes the calculation of a mean quadratic error of distances between the unit sphere and the transformed measurements. The norm of the nth transformed measurement $X_{i,c}$ (its algebraic distance to the unit sphere) is expressed as $\|X_{i,c}\|_2 = \|D(X_i - b)\|_2$. The sum of squared errors for the N measurements of the considered set is written as $\chi^2 = \Sigma_i(\|D(X_i - b)\|_2 - 1)^2$, and the mean squared error is expressed as $\rho = \sqrt{\chi^2/N}$. This error is compared with a threshold (for example 5%, which corresponds to an error of about 2 µT for the earth's magnetic field with amplitude 47 µT), to decide whether or not the fit is sufficient.

In one possible embodiment, a potential improvement to the calibration is examined. To achieve this, the method includes the application of a current calibration transformation (i.e. the calibration currently applied to the raw measurements) to the measurements of said set to supply calibrated measurements, determination of a degree of fit of the calibrated measurements to the unit sphere and the selection UPD of the test transformation to the unit sphere as a new current calibration transformation if the degree of fit of the transformed measurements to the unit sphere is more than the degree of fit of the calibrated measurements to the unit sphere. The current transformation is applied to all measurements output by the magnetometer, until a new transformation associated with a parametric surface considered to be better fitted to the measurements is substituted for it.

Alternatively, the test transformation can transform the parametric surface into a sphere with radius $B_0$, where $B_0$ is the norm of the geomagnetic field, and determination of a degree of fit of the transformed measurements to the sphere can include the calculation of a difference in norm between the transformed measurements $X_c$ and the sphere with radius $B_0$: $|\|X_c\|_2 - B_0|$. A characteristic of this difference in norm can be evaluated, for example its maximum or one of its percentiles (for example 95%), that is compared with a threshold above the noise level, for example 5 µT, to decide whether or not the fit quality is sufficient Furthermore, this characteristic can be used to authorise implementation of the automatic calibration according to the invention if an excessive difference in the norm is observed, for example more than 2 µT.

Figure 3A:
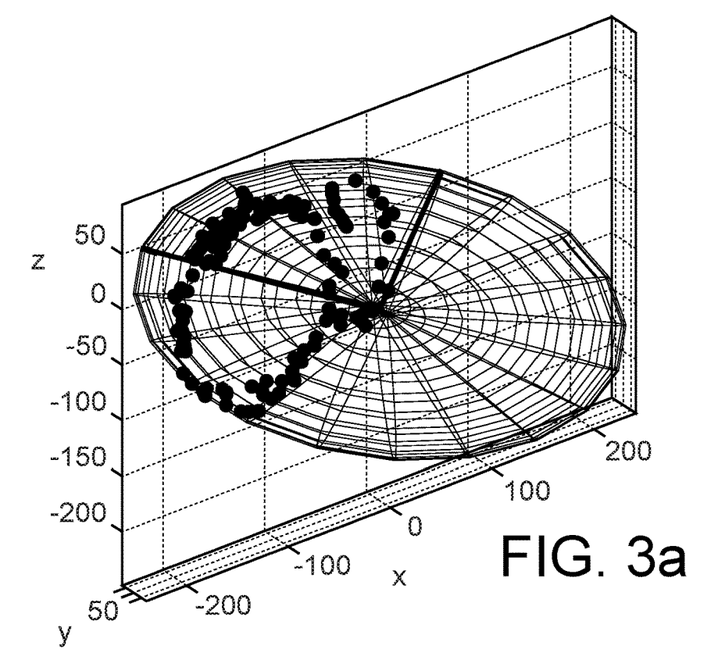
FIGS. 3a and 3b represent a parametric surface fitted to a set of measurements made by a magnetometer using a one-step ellipsoid fitting method and measurements calibrated by application of the transformation to change from this surface to the unit sphere.
Figure 3B:
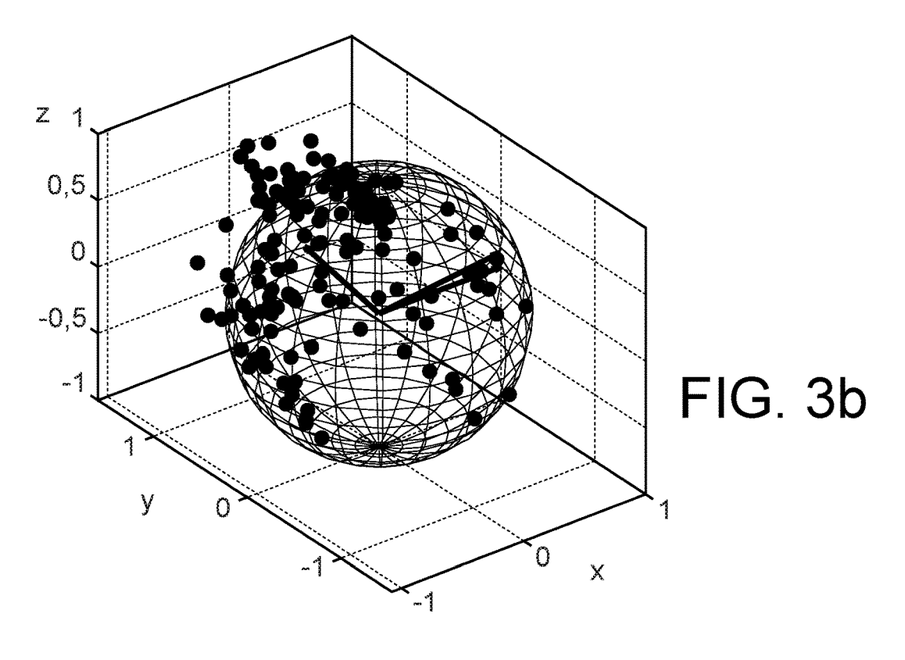
Figure 4A:
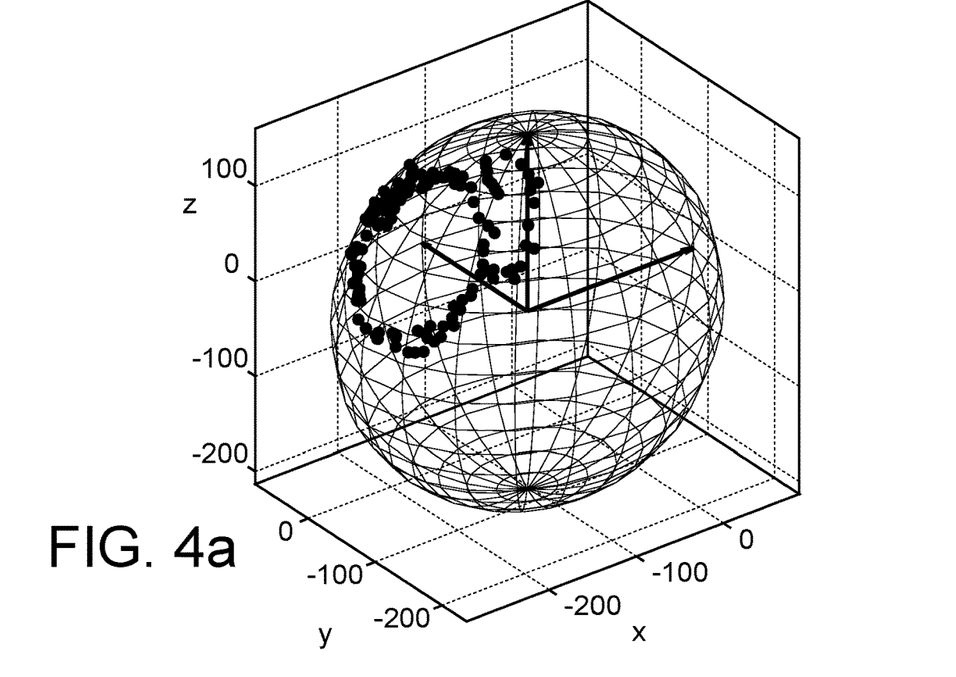
FIGS. 4a and 4b represent a parametric surface fitted to a set of measurements made by the magnetometer using a two-step fitting method and measurements calibrated by application of the transformation to change from this surface to the unit sphere, the set of measurements being identical to that in FIGS. 3a and 3b.
Figure 4B:
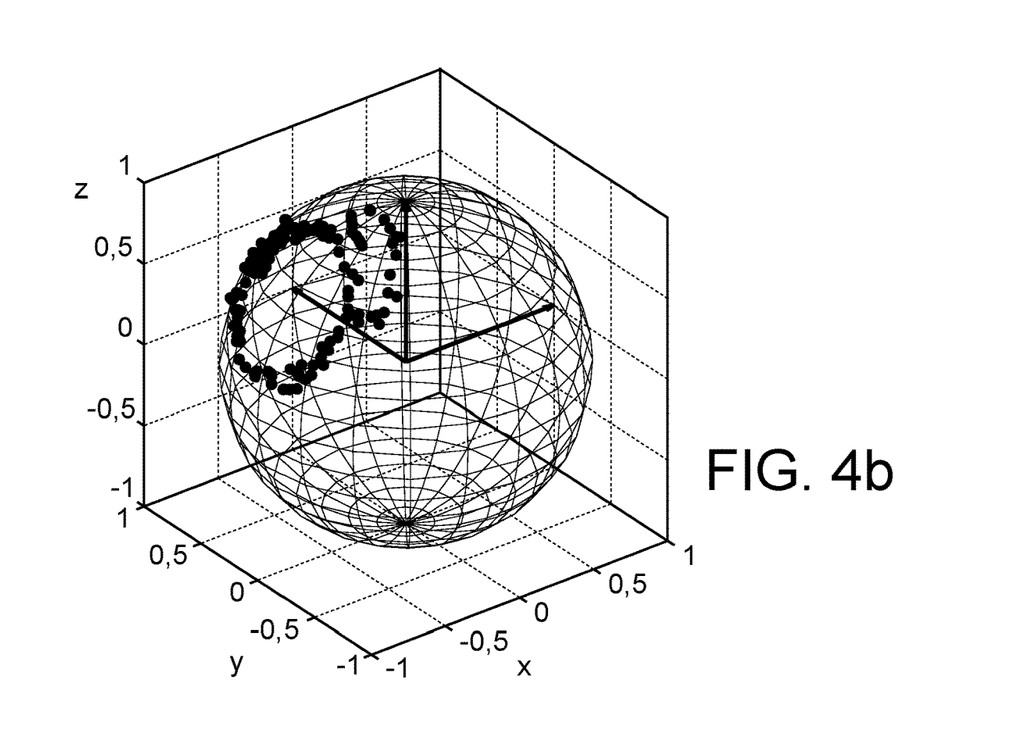

FIGS. 3a and 4a show a configured surface fitted to a set of magnetometer measurements using a single-step ellipsoid fitting method and according to a two-step fitting method respectively, in this case the spatial distribution indicator r of the measurements being equal to 9.98. FIG. 3b and FIG. 4b show measurements calibrated by application of the transformation to change from the surface in FIG. 3a and FIG. 4a respectively, to the unit sphere. It can be seen that in this case the two-step method is a more appropriate fitting method than the one-step ellipsoid fitting method.

The invention is not limited to the method described above, but also includes a computer program including instructions for execution of this method when said program is executed on a computer. And the invention also includes a device, for example an inertial navigation unit, comprising a data processing unit configured to implement this method.

What is claimed is:

1. A computer-implemented method for calibrating a triaxial sensor, comprising the steps of:
    calculating a spatial distribution indicator of a set of measurements output by the triaxial sensor, and
    determining, using a fitting method, parameters of a parametric surface that can be used to fit said surface to said set of output measurements,
wherein the method includes a step of selecting the fitting method from among several predetermined fitting methods as a function of said spatial distribution indicator.

2. The method according to claim 1, wherein the predetermined fitting methods include an ellipsoid fitting method, a sphere fitting method and two-step fitting method consisting of a first fitting to a sphere followed by a second fitting to an ellipsoid the centre of which is coincident with the centre of the sphere of the first fitting.

3. The method according to claim 1, wherein when the spatial distribution indicator is less than a first threshold, the selected fitting method is the ellipsoid fitting method, when the spatial ellipsoid distribution indicator is more than the first threshold and less than a second threshold, the selected fitting method is the two-step fitting method, and when the spatial distribution indicator is more than the second threshold, the selected fitting method is the sphere fitting method.

4. The method according to claim 1, wherein calculating the spatial distribution indicator comprises determining a correlation matrix of measurements of said set and determining the condition number of the correlation matrix, said condition number forming the spatial distribution indicator.

5. The method according to claim 1, further including a preliminary step (SLT) of selecting the measurements of said set among the measurements output by the triaxial sensor, said preliminary step comprising estimating a change in the orientation of the triaxial sensor between the output measurements and selecting measurements associated with sensor orientations deemed to be sufficiently different by comparison with a threshold.

6. The method according to claim 5, wherein the triaxial sensor is a magnetometer and estimating a change in the sensor orientation between the output measurements includes determining a difference between the amplitude of an output measurement component and the amplitude of a component of at least one of previously selected measurements.

7. The method according to claim 5, wherein the triaxial sensor is a magnetometer and estimating a change in the orientation of the magnetometer between the output measurements makes use of measurements output by a gyrometer, or uses both measurements output by the magnetometer and measurements output by an accelerometer.

8. The method according to claim 1, further including determining of a test transformation that transforms the parametric surface fitted to said set of output measurements into a unit sphere, applying the test transformation to the measurements of said set to obtain transformed measurements and determining a degree of fit of the transformed measurements to the unit sphere.

9. The method according to claim 8, further including applying a current calibration transformation to the measurements of said set to obtain calibrated measurements, determining a degree of fit of the calibrated measurements to the unit sphere and selecting the test transformation as a new current calibration transformation if the degree of fit of the transformed measurements to the unit sphere is more than the degree of fit of the calibrated measurements to the unit sphere.

10. A computer program including instructions for execution of the method according to claim 1 when said program is executed on a computer.

11. A device comprising a data processing unit configured to use the method according to claim 1.

* * * * *